Aug. 11, 1970 C. P. HAYUNGA 3,523,352
APPARATUS FOR MOUNTING SEMICONDUCTOR CHIPS WITH BALL CONTACTS UP ON A SUBSTRATE AND FORMING ELECTRICAL STRAP CONNECTIONS TO THE SUBSTRATE FROM THE BALL CONTACTS
Filed April 15, 1968 9 Sheets-Sheet 1

INVENTOR
CARL P. HAYUNGA

BY Kenneth R. Stevens
ATTORNEY

APPARATUS FOR MOUNTING SEMICONDUCTOR CHIPS WITH BALL CONTACTS UP ON A SUBSTRATE AND FORMING ELECTRICAL STRAP CONNECTIONS TO THE SUBSTRATE FROM THE BALL CONTACTS

Filed April 15, 1968 9 Sheets-Sheet 2

Aug. 11, 1970 C. P. HAYUNGA 3,523,352

APPARATUS FOR MOUNTING SEMICONDUCTOR CHIPS WITH BALL CONTACTS UP ON A SUBSTRATE AND FORMING ELECTRICAL STRAP CONNECTIONS TO THE SUBSTRATE FROM THE BALL CONTACTS

Filed April 15, 1968 9 Sheets-Sheet 3

APPARATUS FOR MOUNTING SEMICONDUCTOR CHIPS WITH BALL CONTACTS UP ON A SUBSTRATE AND FORMING ELECTRICAL STRAP CONNECTIONS TO THE SUBSTRATE FROM THE BALL CONTACTS

Filed April 15, 1968

APPARATUS FOR MOUNTING SEMICONDUCTOR CHIPS WITH BALL CONTACTS UP ON A SUBSTRATE AND FORMING ELECTRICAL STRAP CONNECTIONS TO THE SUBSTRATE FROM THE BALL CONTACTS

Aug. 11, 1970 C. P. HAYUNGA 3,523,352

APPARATUS FOR MOUNTING SEMICONDUCTOR CHIPS WITH BALL CONTACTS UP ON A SUBSTRATE AND FORMING ELECTRICAL STRAP CONNECTIONS TO THE SUBSTRATE FROM THE BALL CONTACTS

Filed April 15, 1968 9 Sheets-Sheet 6

Aug. 11, 1970 C. P. HAYUNGA 3,523,352

APPARATUS FOR MOUNTING SEMICONDUCTOR CHIPS WITH BALL CONTACTS UP ON A SUBSTRATE AND FORMING ELECTRICAL STRAP CONNECTIONS TO THE SUBSTRATE FROM THE BALL CONTACTS

Filed April 15, 1968 9 Sheets-Sheet 8

Aug. 11, 1970 C. P. HAYUNGA 3,523,352

APPARATUS FOR MOUNTING SEMICONDUCTOR CHIPS WITH BALL CONTACTS UP ON A SUBSTRATE AND FORMING ELECTRICAL STRAP CONNECTIONS TO THE SUBSTRATE FROM THE BALL CONTACTS

Filed April 15, 1968 9 Sheets-Sheet 9

3,523,352

APPARATUS FOR MOUNTING SEMICONDUCTOR CHIPS WITH BALL CONTACTS UP ON A SUBSTRATE AND FORMING ELECTRICAL STRAP CONNECTIONS TO THE SUBSTRATE FROM THE BALL CONTACTS

Carl P. Hayunga, Poughkeepsie, N.Y., assignor to International Business Machines Corporation, Armonk, N.Y., a corporation of New York Filed Apr. 15, 1968, Ser. No. 721,325
Int. Cl. H05k *13/00;* B23p *19/04*
U.S. Cl. 29—203 5 Claims

ABSTRACT OF THE DISCLOSURE

An apparatus for positioning the backside of semiconductor chips onto a substrate with ball contacts on the topside of the chip and making strap connections from the ball contacts to the substrate which comprises a rotatable work tool table for automatically mounting semiconductor chips. A rotatable work tool table sequentially indexes over a substrate so as to deposit flux, position a chip, and form and position electrical connection straps to the substrate from the chip balls. A substrate holder grips the substrate under a predetermined force and moves towards the particular stationary work tool which has been indexed over the substrates so as to bring the substrate surface into contacting relationship with the positioned work tool.

BACKGROUND OF THE INVENTION

This invention relates to an apparatus for automatically positioning semiconductor chips and their electrical connection straps onto a substrate, and more particularly to an apparatus for backsidedown joining, that is ball contacts up, of semiconductor chips to a substrate. Previously in the fabrication of modular devices, a primary concern existed with regard to the reduction of thermal resistance, both internal and external. By achieving low thermal resistances increased modular power handling capacity or a higher dissipation rate is obtainable. The internal resistance, as for example between a transistor chip and substrate, is influenced largely by the transistor junction area and geometry of the chip substrate bond, as well as the substrate material. The junction area and geometry of the chip are dictated to a large extent by the application of the device. Moreover, since in most instances a solder connection is most desirable, the bond material itself becomes a virtually fixed parameter. Therefore, in order to reduce the thermal conduction resistance, as well as the spreading resistance; it is necessary that the contact area between the device and the substrate be increased. This increased contact area is obtained by mounting the device with ball contacts up. However, to do this, it is necessary to connect the ball contacts to their respective substrate land patterns with topside straps.

The active semiconductor chips are generally encapsulated in a material such as glass. Regardless of whether the chip is mounted on its substrate with chip balls up or down, a problem exists in that mechanical stresses may be sufficient to destroy the glass passivated encapsulation. In the past, this problem has been somewhat diminished since automated apparatuses positioned a chip onto a substrate with its ball contacts down, that is in direct contact with the substrate. In this instance, most of the contacting force is absorbed by the ball contacts and not by the glass passivated device. Obviously, this problem becomes extremely acute when a semiconductor chip is backside-down mounted with ball contacts up, since the ball contacts do not directly contact the substrate surface. The glass encapsulation absorbs the entire force when it is brought into contact with the substrate during positioning. Thus, in backside-down mounting of semiconductor chips, cracking of the glass encapsulation is a serious problem. Additionally, when mounting semiconductor chips ball contacts up, the effect of strap stress when placing the strap onto a substrate creates another significant problem area.

Generally, in the past, automated fabrication machines in the semiconductor chip mounting area have employed a stationary substrate holder over which is positioned a work tool for mounting a semiconductor chip. In the various mounting operations, such as flux application, chip positioning, and strap placement, a movable work tool is moved into contact with a substrate which is held in a stationary position. This arrangement requires that each work tool be extended within close tolerances so as to contact the substrate with a sufficient working force, and yet not cause damage to the device being applied to the substrate or other elements necessary in the joining process. Thus, in an arrangement where the substrate is held stationary extremely close tolerances are imposed on the apparatus.

It is an object of this invention to automatically mount semiconductor chips on a substrate with ball contacts up in a simple and efficient manner while maintaining increased output yields.

Another object of this invention is to join a glass encapsulated semiconductor chip to a substrate without damaging the glass encapsulation or topside interconnection straps used to join the chip to the substrate.

A further object of this invention is to move work tools carrying semiconductor chips into a contacting relationship with a substrate wherein the contacting force is readily adjustable and which obviates critical tolerances requirements normally necessary to bring tools into contacting relationship with a substrate.

SUMMARY OF INVENTION

This invention is an apparatus for mounting the backside of a semiconductor chip onto a substrate with the ball contacts of the chip on the topside and making strap connections from the ball contacts to the substrate. A rotatable tool table having flux application tools, chip placement tools, and strap forming and placement tools is sequentially indexed over a substrate holder. With a respective work tool located above the substrate holder and in a stationary position, a substrate which is held in the substrate holder by gripping means under a predetermined force is raised towards the work tool and through a distance which ultimately causes contact between the upper substrate surface and the work tool. Further upward movement of the holder causes the work tool to exert a sufficient force on the substrate upper surface such that the predetermined force exerted by the gripping means is exceeded, at which time the substrate is caused to move away from the work tool. A stationary substrate table resets original position in anticipation of a subsequent operation which will be performed by the next worked tool to be indexed over the substrate holder.

Other objects of the invention will be pointed out in the following description and claims and illustrated in the accompanying drawings, which disclose, by way of examples, the principle of invention and the best modes, which have been contemplated of applying that principle.

GENERAL DESCRIPTION OF OVERALL APPARATUS

Figure 1:
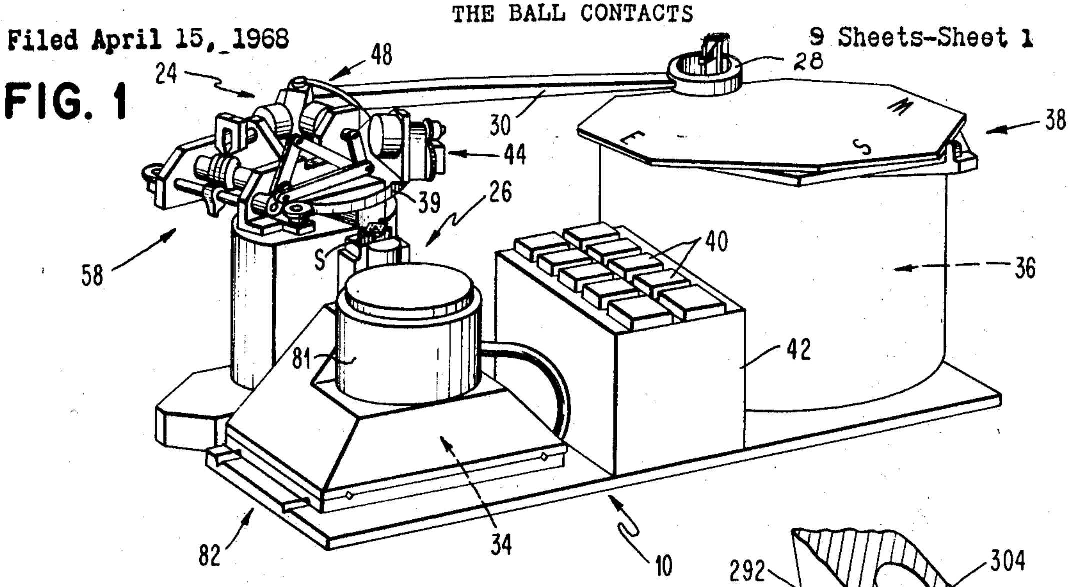
FIG. 1 is a perspective view illustrating the overall strap and chip apparatus.

The general nature of the structure and the overall mode of operation of the apparatus will first be described, after which the specific structure of each of the several work tool means or separate units will be explained in greater detail.

Now referring to FIGS. 1, 2A–2D, and 3, and automatic chip and strap positioning apparatus 10 is employed to join a glass passivated semiconductor device 12 to a substrate S, and also to form a pair of topside connection straps 16 which respectively join a pair of ball contacts 18 to an emitter land pattern 20 and a base land pattern 22, as particularly shown in FIGS. 2A–2D.

A rotatable work tool table 24 is sequentially indexed over a substrate holder assembly means 26 which contains a substrate generally indicated as S. Movement of an operator stylus 28 connected to a pantograph arm 30 positions the substrate S in an X–Y plane with respect to the rotatable work tool table 24. An indexing mechanism 34 in the substrate holder assembly 26, and an indexing mechanism 36 connected to a template holder 38 will move both the substrate S and the template holder 38 to corresponding orientations, indicated at N, E, S, or W. In other words, fine positioning of the substrate S is provided by operation of the operator's stylus 28 while course positioning is provided by operation of the indexing mechanism 34. Control of the various indexing mechanisms is provided by actuation of an appropriate push button 40 on an operator's console 42.

Figure 2B:
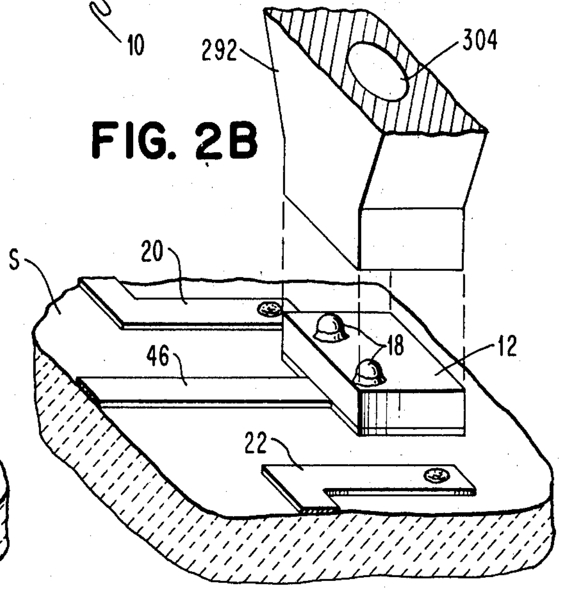
FIGS. 2A through 2D illustrate the sequence of operations performed by the apparatus of FIG. 1 for mounting semiconductor chips with ball contacts up and making strap connections to a substrate from the ball contacts.
Figure 2A:
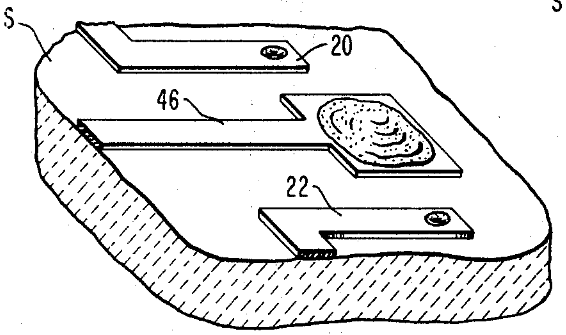
Figure 3:
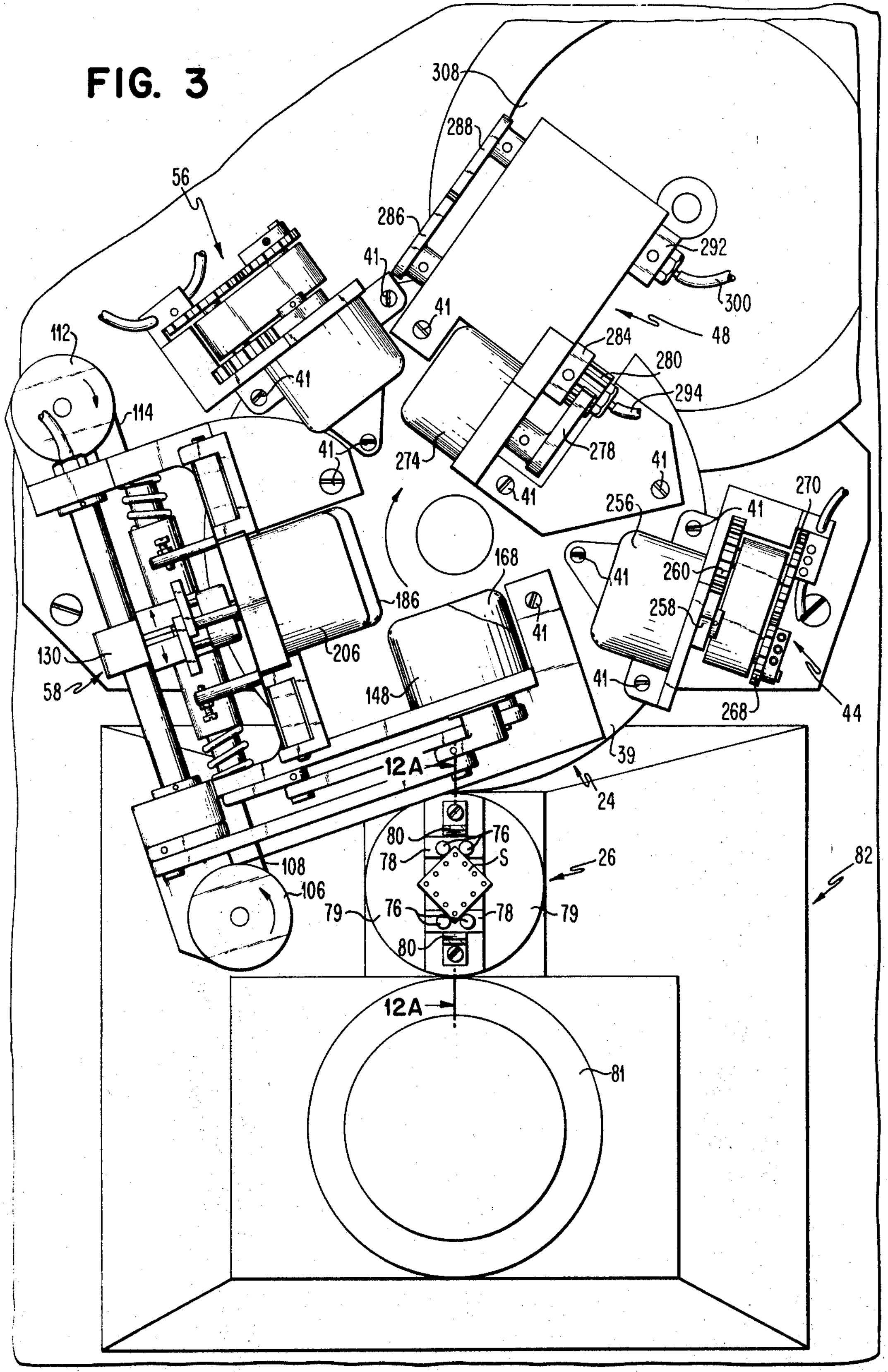
FIG. 3 is a partial plan view of FIG. 1 generally illustrating the rotatable tool table, having a plurality of tools mounted thereon, and a substrate holder assembly.

The rotatable work tool table 24 supports a plurality of tools mounted on a platform 39 by a plurality of bolts 41, and includes a flux tool 44 for depositing flux on the emitter land pattern 20, the base land pattern 22 and a collector pad 46, as illustrated in FIG. 2A. Next, a chip positioner work tool 48 is indexed over the substrate S so as to deposit a semiconductor chip 12 onto the collector pad 46 by means of a chip placement finger 292. Prior to being indexed over the substrate, the chip positioner work tool picked up a semiconductor chip from a bowl, or dispensing means 308, as shown in FIG. 3.

Figure 2C:
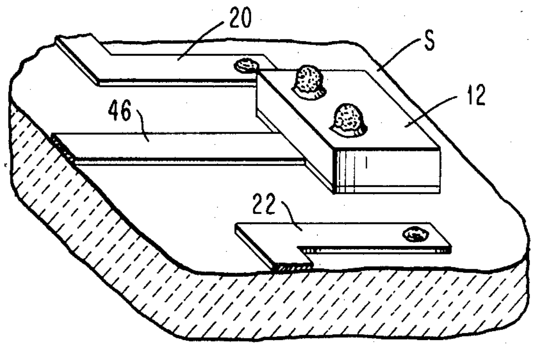

Next, a flux tool 56 for depositing flux on the pair of ball contacts 18 is indexed over the substrate S so as to perform its operation, as illustrated in FIG. 2C.

Finally, a strap punch and placement work tool 58 is indexed over the substrate S to deposit or position the pair of topside connection straps 16 so as to provide electrical connections between the ball contacts 18 and their respective substrate land patterns 20 and 22. With the connection straps 16 now in place, the rotatable work tool table 24 is further indexed in a clockwise direction to what may be termed a starting or load position, which load position is indicated in FIG. 3.

In the load position, a pick up finger 284 on the chip positioner work tool 48 operates to pick up a semiconductor chip from the bowl 308 and transfer it to a placement finger 292. It is the placement finger 292 which actually contacts the substrate S as shown in FIG. 2B. A rotary solenoid 274 by means of appropriate gearing means 278, 286 and 288 drive the pick up finger 284 and the placement finger 292 in synchronism, as hereinafter more fully described.

Figure 2D:
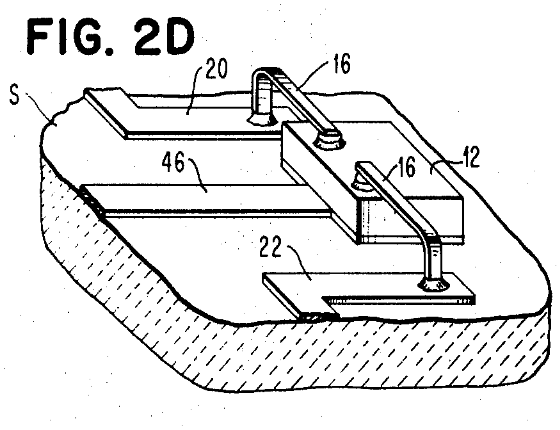

In the load position, strap punch and placement work tool 58, as generally shown in FIG. 3, forms left and right straps as ribbon material is pulled into a guide track from right and left spools of ribbon or strap material 106 and 112, respectively. The pair of straps are then transferred to a strap placement probe 130, and later placed on the substrate S, as shown in FIG. 2D, when the strap punch and placement work tool 58 is eventually indexed to a position over the substrate S.

The substrate holder assembly means 26 can accurately position a substrate with respect to a stationary work tool. The substrate is contacted at four points by four pins 76 positioned in a pair of arms 78. The pair of arms 78 are slideably movable between a pair of locating turrets 79. Adjustable springs designated generally at 80 holds the substrate S under a predetermined force at the contact points between the plurality of pins 76 and the sides of the substrate S by varying the force on the pair of arms 78.

Depression of the appropriate push button 40 will energize a motor 81 in the substrate holder assembly means 26 so as to rotate the pair of turrets through indexing mechanism 34 to any one of four positions. Fine positioning of the substrate S in an X–Y plane is accomplished by moving the pantograph arm 30 so as to move an X–Y table 82.

Once proper X–Y orientation exists between the substrate S and a work tool, an air cylinder raises the pair of arms 78 so as to move the substrate S toward the work tool. To insure that the substrate reaches the work tool, the pair of arms 78 are raised a distance which exceeds the distance which actually separated the stationary work tool and the substrate before the air cylinder was energized. Since the substrate is held only by the pins 76 frictionally engaging the substrate sides, the work tool can push the substrate down along the four pins 76. A stationary substrate table is moved into contact with the underside of the substrate S as the substrate is moved away from a work tool so as to raise the substrate to a starting position in prepartaion for contact with the next work tool.

It is apparent that this method of moving a substrate into contact with a work tool possesses many distinct advantages. For example, when a work tool positions a semiconductor chip on a substrate, the chip is subjected to an impulse force which is limited to the mass of the substrate, e.g., one gram, moving through a stroke of approximately 50 mils. Furthermore, the placement force which the semiconductor chip is subjected is determined solely by the frictional force created by the four pins 76 contacting the side of the substrate, and which for example is adjustable from approximately 5 to 50 grams. Additionally, any accumulation of tolerance variations by virtue of substrate, chip pad, chip thickness, and location of the other work tools is cancelled by the inherent fact that the substrate is raised a predetermined fixed distance which exceeds the distance which actually separates the substrate from a work tool.

DETAILED DESCRIPTION OF STRAP PUNCH AND PLACEMENT WORK TOOL

The structural details of the strap punch and placement work tool is shown in greater detail in FIGS. 4, 5, 6, 7, 8, and 9A–9D, generally shown in FIG. 3 as element 58. In the detailed description of the strap punch and placement work tool 58 it is to be understood that the apparatus simultaneously forms a left and a right strap and the straps are ultimately transferred to a probe for placement onto the substrate. The description will be detailed mainly with reference to the right strap forming mechanism; however, it is readily apparent that the apparatus forming the left strap is of an identical nature. Like reference numerals have been used to indicate like elements previously described with respect to FIGS. 1 and 3.

A right spool of ribbon strap material 106 is unwound to thread strap material 108 into a right guide track 110. The guide track 110 is of appropriate dimensions to receive the particular type of material 108 being threaded therein. A guide means 111 helps guide the material into the guide track 110. Correspondingly, left spool 112, material 114, and left guide track 116 are structurally equivalent.

In order to pull the ribbon material into a cutting area, a left and a right hammer 118 and 120, respectively, are axially mounted and slideably movable along a knife shaft 122 and the shaft 122 is supported at its extremities by frame member 124. The right and left hammers 118 and 120 are normally urged into a contacting position by a right hammer spring 126 and a left hammer spring 128.

A pick up proble 130 is fixedly mounted on a probe shaft 132 by means of a screw 134. A controllable source of air supply means 136 connects to a central hole 138 in the probe shaft 132 by means of a fitting 140 and a bearing 142 which allows the probe shaft 132 to rotate with respect to the frame member 124. The air supply is connected to a central bore 144, in the probe 130 via hole 146 in the probe shaft 132.

Figures 4, 5:
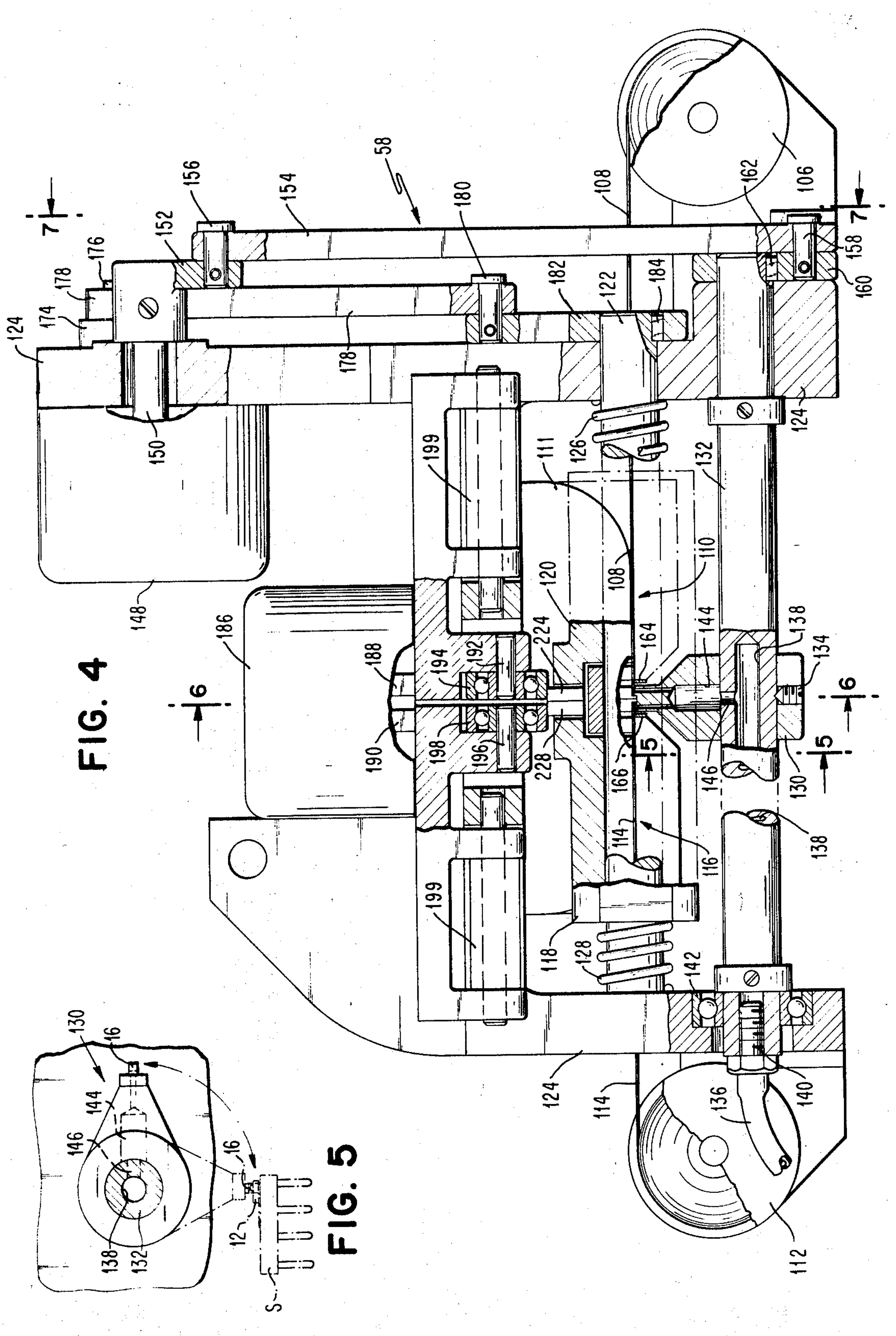
FIG. 4 is an enlarged partial sectional view of FIG. 3 illustrating the strap former and placement tool in greater detail.
FIG. 5 is an enlarged view along line 5—5 of FIG. 4 illustrating the movement of a strap probe from a placement position to a forming position.

In order to move the probe from a strap pick up position, as shown in the solid lines of FIG. 5, to a position 90° away, shown in dotted lines, so as to place the straps on a substrate S, a rotary solenoid 148 is mounted on the frame 124 and connects by way of a shaft 150 to a driving probe arm 152 and then to a probe link 154 by means of a pin 156. Probe link 154 is connected by means of a pin 158 at its other end to a drive probe arm 160, and the drive probe arm is secured to the probe shaft 132 by means of a key 162.

In order to rotate a right and left knife 164 and 166, they are mounted on the knife shaft 122, e.g., by a screw 123. A rotary solenoid 168 drives a rotary shaft 170 which in turn is secured by a screw means 172 to a driving knife arm 174. Arm 174 connects by means of a pin 176 to a knife link 178, which in turn connects by means of a pin 180 to a driven knife arm 182. Driven knife arm 182 is fixedly attached to the knife shaft 122 by means of a key 184.

In order to force the left and right hammers into the ribbon material by means of dimples, as more clearly shown in FIGS. 9A–9D, a solenoid 186 drives a pair of right and left shafts 188 and 190, respectively. Connected to the right shaft 188 by means of a pin 192 is a right driving bearing 194 which drives the right hammer 120 into the ribbon material 108. Correspondingly, a pin 196 connects a left driving bearing 198 to the left shaft 190. A right and left positioning means, shown generally as elements 199, are employed to maintain a pair of armatures, not shown, so as to move shafts 188 and 190 into proper position.

Figure 6:
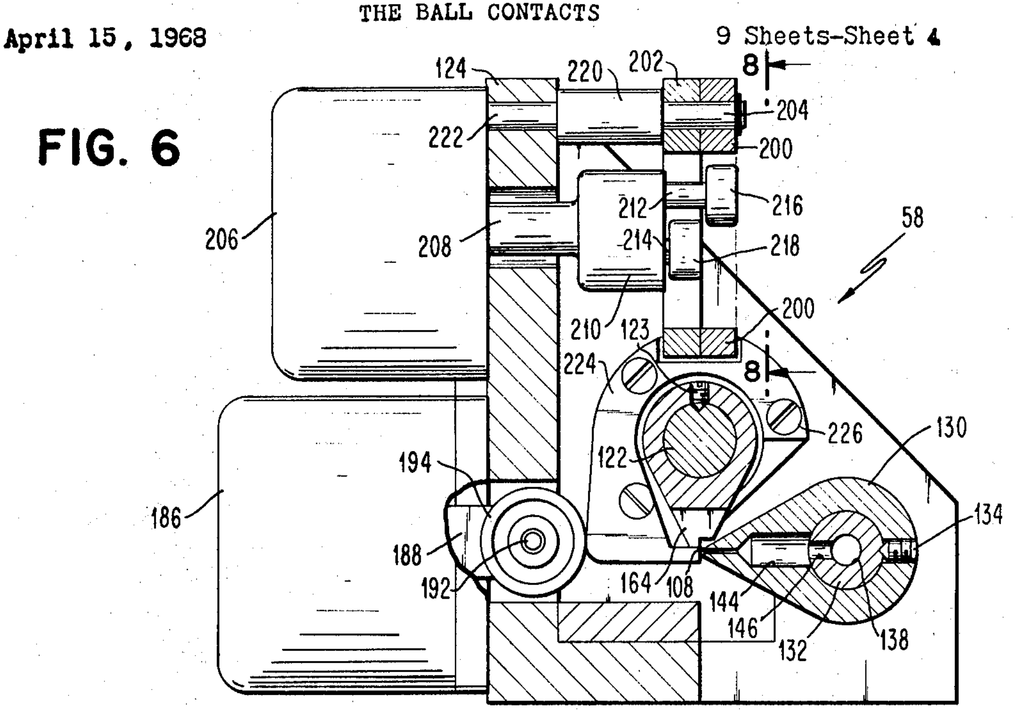
FIG. 6 is an enlarged partial sectional view along line 6—6 of FIG. 4 illustrating the hammer spreader means.
Figure 8:
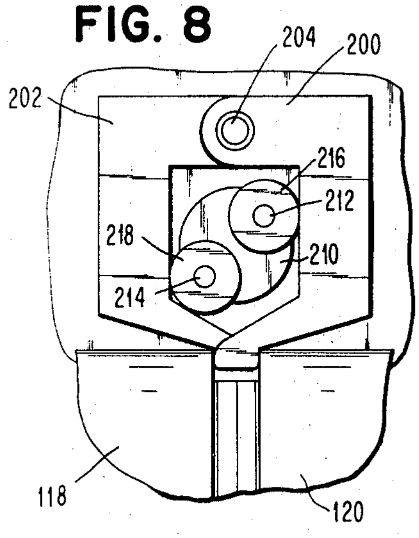
FIG. 8 is a view along line 8—8 of FIG. 6 illustrating the spreader arms.
Figure 7:
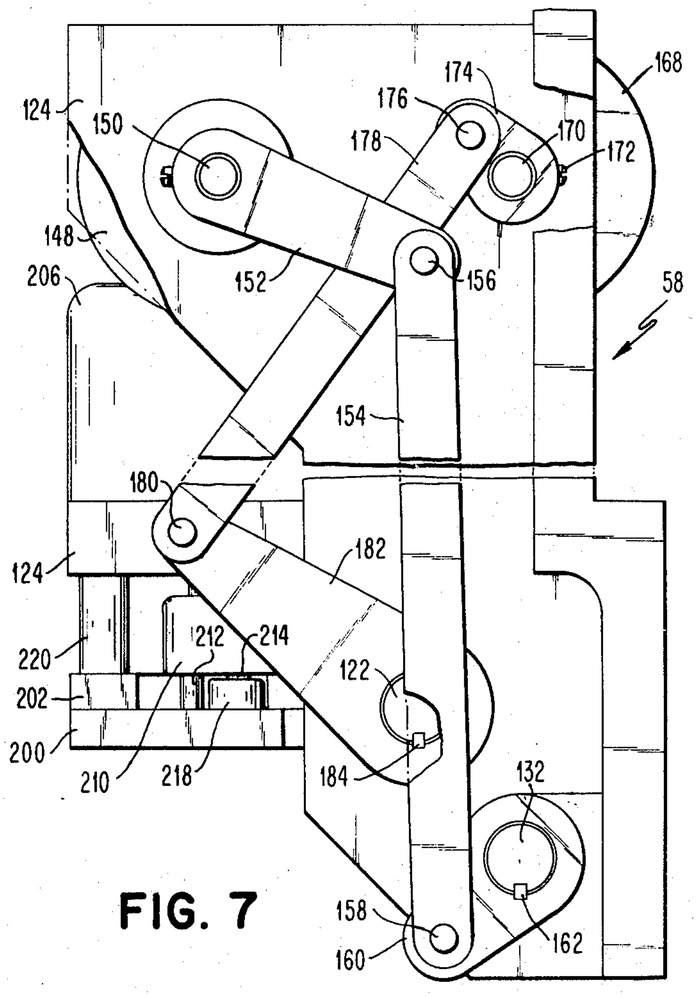
FIG. 7 is an enlarged view along line 7—7 of FIG. 4 illustrating the driving link arrangements.

As more clearly shown in FIGS. 6 and 8, in order to move the left and right hammers 118 and 120 against the force of the left and right hammer spring 128 and 126, a right spreader arm 200 and a left spreader arm 202 are hingedly mounted by pin 204. Actuation of a spreader solenoid 206 rotates a solenoid shaft 208 which terminates in a head portion 210. Connected to the head portion 210 are a pair of shafts 212 and 214 upon which are mounted roller elements 216 and 218, respectively. They are mounted to contact the internal perimeter formed by the right and left spreader arms 200 and 202 so as to move them apart and thus spread the left and right hammers 118 and 120. The spreader arms are mounted by means of a support member 220 connected to the frame 124 by means of a pin 222.

Affixed to each of the left and right hammers 118 and 120, respectively, is a hammer head portion. In FIG. 6 the right hammer head portion is shown at 224 and is being held in position by a plurality of screws 226. In FIG. 4, the right and left hammer head portions are diagrammatically shown at 224 and 228, respectively. FIG. 6 only illustrates the right knife head 164, it is fixedly mounted on the knife shaft 122 by means of a screw 123.

OPERATION OF STRAP PUNCH AND PLACEMENT WORK TOOL

Now referring to FIGS. 9A–9D, they clearly show the sequence of operations for forming L-shape straps and transferring them to a work placement probe.

Figure 9A:
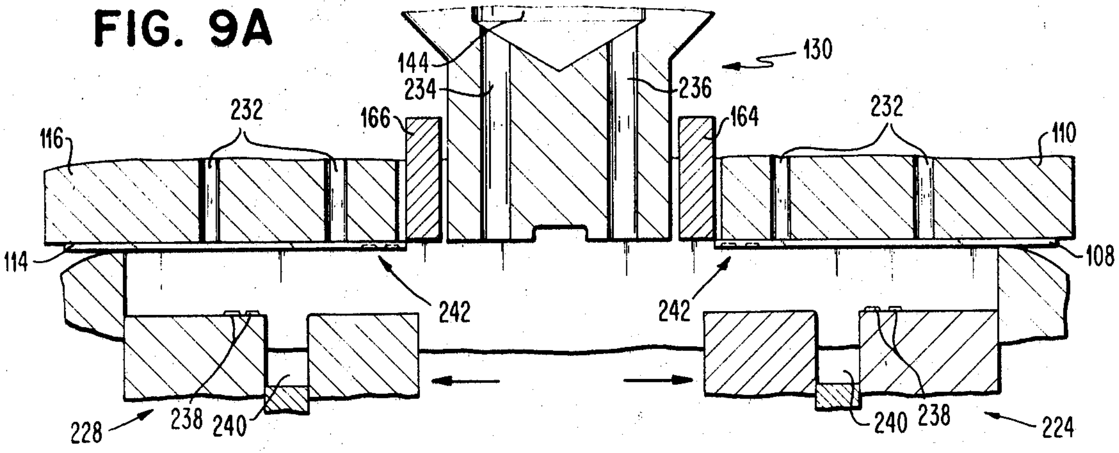
FIGS. 9A through 9D are diagrammatic views of the sequence of operations performed by the strap former and placement tool means.

In FIG. 9A, the left and right strap material is shown already threaded into the right guide track 110 and the left guide track 116. Additionally vacuum holes indicated generally at 232 are cut in the respective guide tracks so as to hold the material in proper position. Actuation of the rotary solenoid for the probe shaft 132 moves the probe 130 into a loading position, as illustrated in FIGS. 9A–9D. Further, it can be seen that the air supply hole 144 in the probe further connects to a pair of holes 234 and 236. The right knife 164 and the left knife 166 are in a retracted position. Additionally, it can be seen that the right hammer head portion 224 and the left hammer head portion 228 have a pair of dimples 238 and a cutaway die portion 240. FIG. 9A represents the first sequence of the operation at which time the right and left hammer head portions are being moved axially away from each other in response to actuation of the right and left spreader arms 200 and 202, respectively.

Figure 9B:
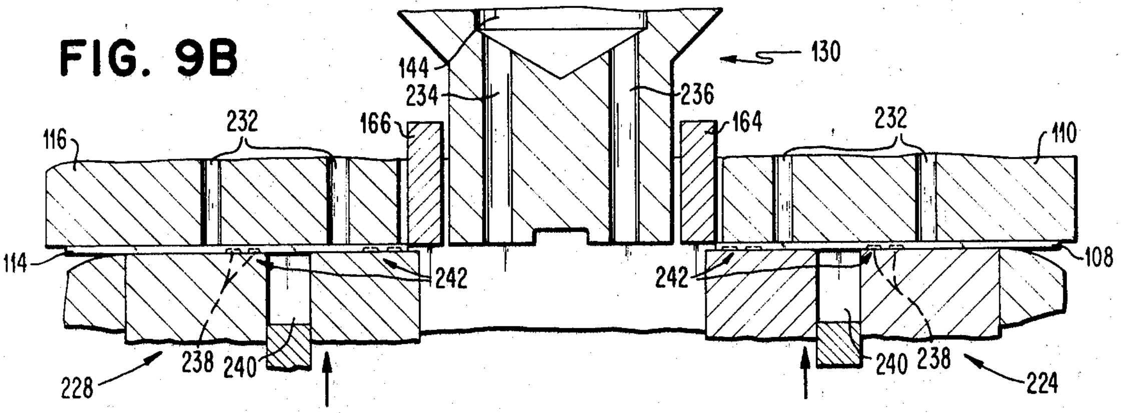

In FIG. 9B, actuation of solenoid 186 has moved the right driving bearing 194 and the left driving bearing 198 into their respective hammers so as to force the dimples 238 into the ribbon or strap material as indicated at 242.

Figure 9C:
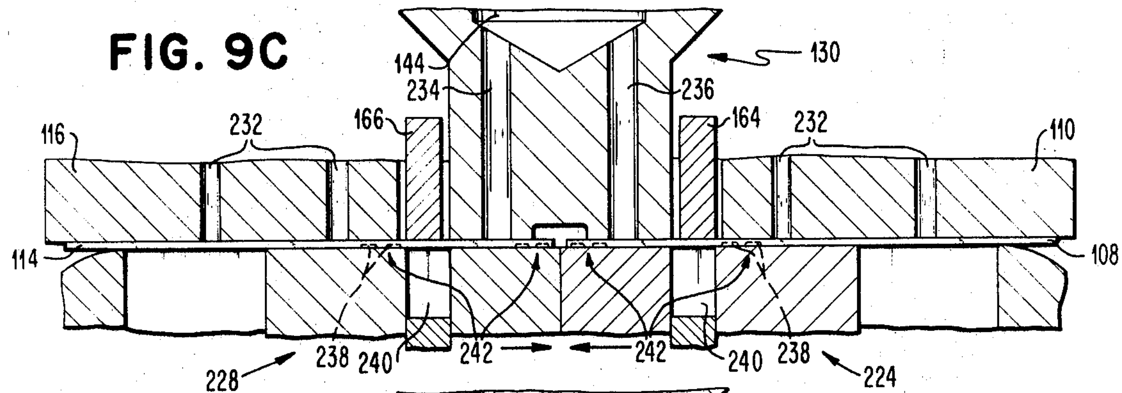
Figure 9D:
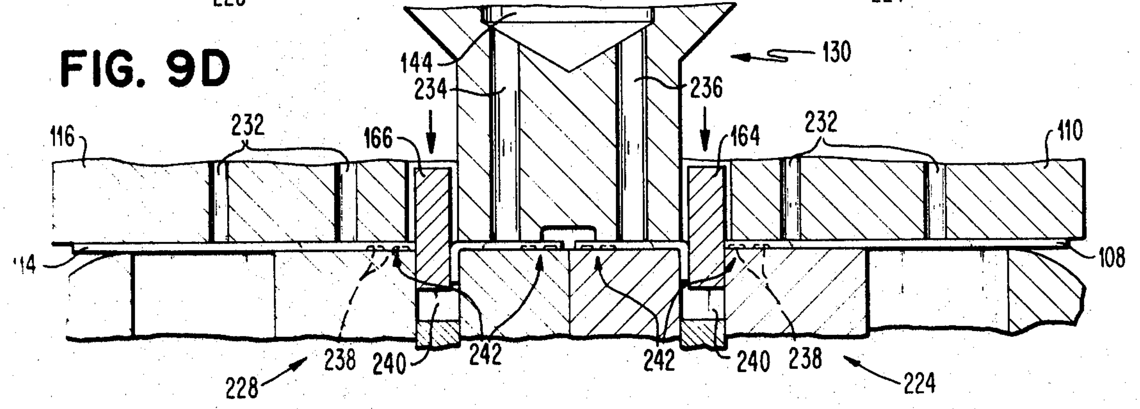

In FIG. 9C, the de-energization of the spreader solenoid 206 allows the right hammer head portion 224 and the left hammer head portion 228 to be moved toward each other until contact and thus pull the material into the cutting area. At this time, the strap material is further held by the vacuum applied to holes 234 and 236 in the probe 130.

In order to form the strap tails and cut the material, the knife shaft 122 is rotated in response to actuation of the rotary solenoid 168 through the appropriate linkages so as to bring the respective knife heads 164 and 166 into the die portions 240 so as to sever and form an L-shape strap.

Finally, knife heads 164 and 166, as well as the right hammer head portion 224 and the left hammer portion 228, are retracted so as to return to a position as indicated in FIG. 9A. At this time, the probe 130 is rotated 90°, as previously illustrated in FIG. 5, so as to be in a position to contact the substrate when the strap probe 130 eventually is indexed around to the substrate. During this indexing time, the straps are held in position by the vacuum applied through the holes 234 and 236. Obviously, the vacuum is cut off when the straps are eventually deposited on the substrate S, or, in fact, a slight positive pressure may be applied to the hole 234 and 236 so as to aid in the removal of the straps from the probe 130.

DETAILED DESCRIPTION OF FLUX TOOLS

Figures 10, 10A:
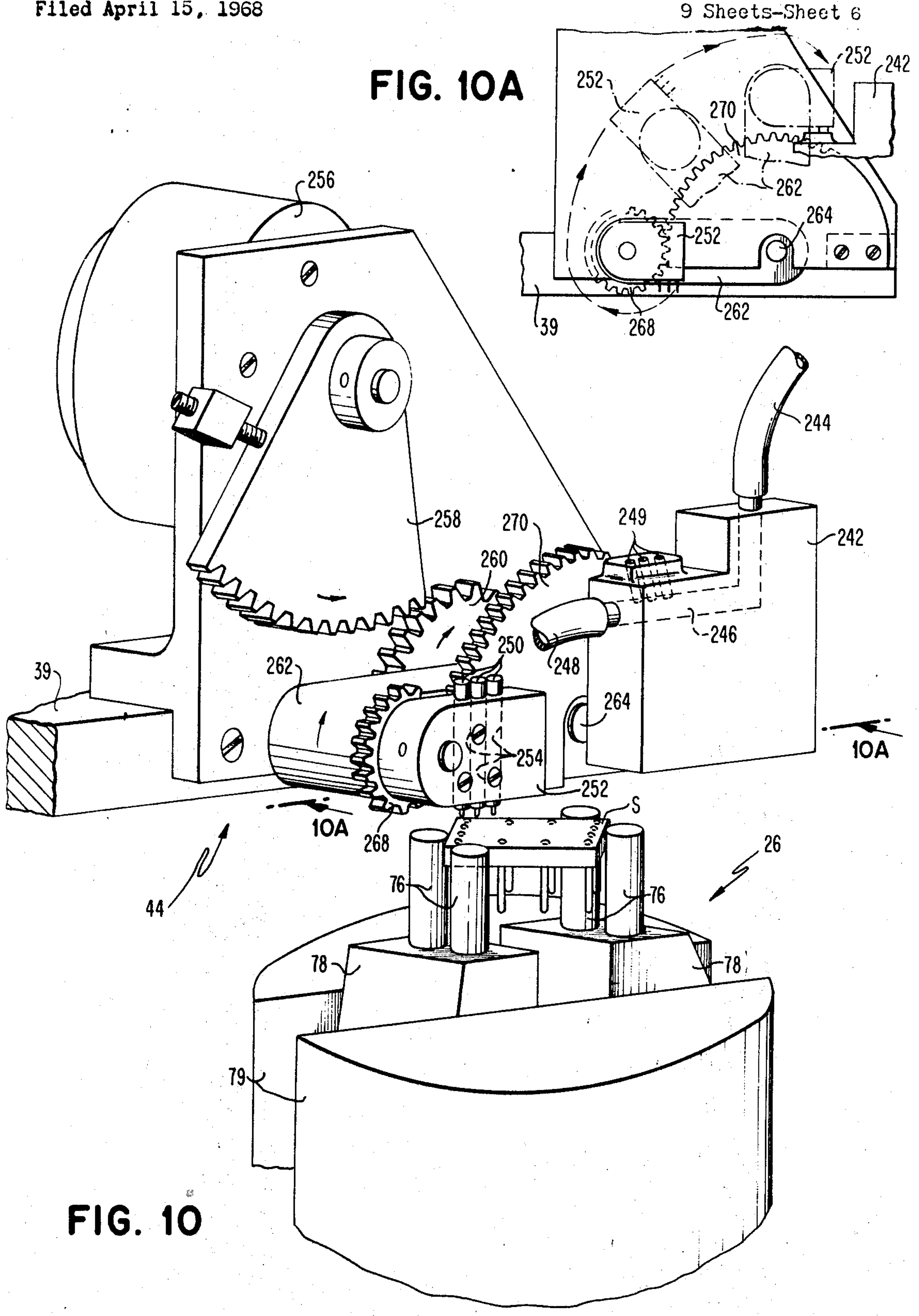
FIG. 10 is a perspective view illustrating a flux tool and its position with respect to a substrate.
FIG. 10A is a diagrammatic view illustrating the movement of the flux tool of FIG. 10.

Now referring to FIGS. 10 and 10A, they show in greater detail the structure of the flux tool 44 for depositing flux on substrate S. Obviously, the flux tool 56 for placing flux on the ball contacts, as illustrated in FIG. 2C, is identical to that now being described except for the fact that a different flux pen arrangement would be used. The flux tool 44 is shown mounted on the platform 39 of the rotatable tool table. Flux is loaded into a tank 242 via an entrance tube 244 and into a reservoir portion 246. A tube 248 may be employed in order to clean the reservoir portion 246. Connecting with the reservoir 246 are three pen or well holes indicated at 249. Three pens 250 are mounted through a solid block 252 having appropriate receiving holes 254. In order to move the flux pens from the position shown in FIG. 10 to one a full 360° away, as indicated by the dotted lines of FIG. 10A, a solenoid 256 drives a gear 258 connected to a meshing gear 260. Connected between the pen block 252 and is a movable block 262. Block 262 is pivotally mounted as indicated at 264 and a gear 268 meshes with a stationary gear 270. Rotation of gear 260 causes the pens 250 to be driven a full 360°.

OPERATION OF FLUX TOOL

With the arrangement shown, the consistent application of flux is relatively time independent. When at rest, the plurality of flux pens stick into the flux as shown in FIG. 10A. When the motor is energized, the pens move from the well holes down to a position over the substrate as shown in FIG. 10. The substrate is raised, and the flux held on the end of the pens is transferred to the collector pad and emitter and base land patterns as shown in FIG. 2A. The pens are then returned to the well holes. The amount of flux applied is a function of flux viscosity and pen diameter. For transfer to the surface of two balls on the chip, as shown in FIG. 2C, pens were fitted having two 8-mil holes 15 mils apart for greater flux carrying capacity.

Further, it can be seen that when the pens 250 are positioned in the well holes 249 the end of the pens protrude into the flux. With this arrangement, no problem of dried flux arises since the end of the pens are always positioned into the fresh flux by piercing the dry flux which may have formed on the surface.

DETAILED DESCRIPTION OF CHIP POSITIONER WORK TOOL

Figure 11:
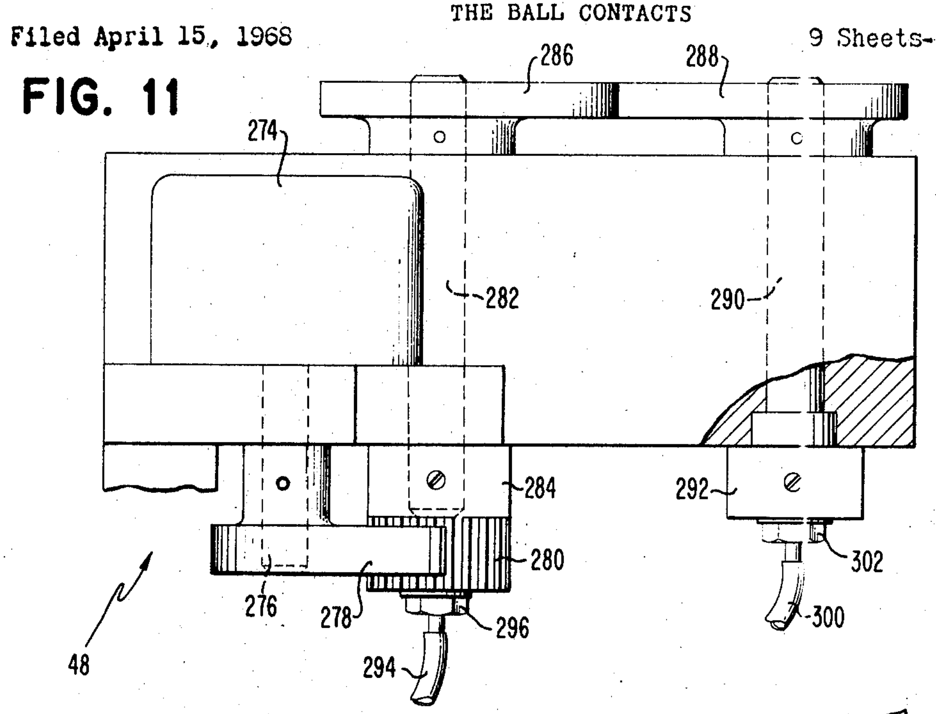
FIG. 11 is an enlarged plan view of the chip placement tool means shown generally in FIG. 3.
Figures 11A, 11B:
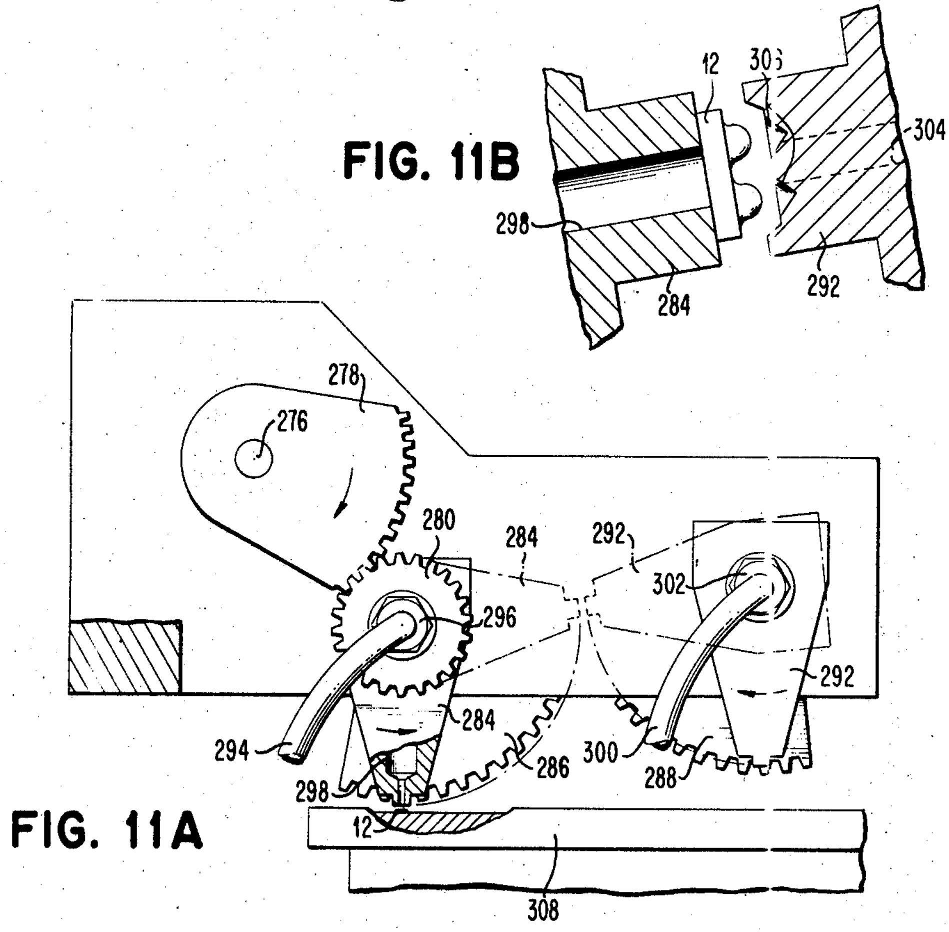
FIG. 11A is a front view of the chip placement tool means of FIG. 11.
FIG. 11B is a partial sectional view of the probes of fingers illustrated by dotted lines in FIG. 11A.

Now referring to FIGS. 11, 11A, and 11B, they show a more detailed description of the chip positioner work tool 48, previously shown generally in FIG. 3. Like reference numerals are used to indicate corresponding elements. A rotary solenoid 274 connected to a solenoid 276 drives a gear 278 which in turn drives a meshing gear 280 fixedly mounted on a shaft 282. Also mounted on shaft 282 is a chip pickup probe 284. Rotation of the shaft 282 also rotates gear 286 which meshes with gear 288 so as to rotate shaft 290. Fixedly attached to shaft 290 is a placement probe 292. An air supply from a tube 294 connects through a sealing nut 296 to a hole 298 centrally located in the pickup probe 284. Similarly, an air supply connects to the placement probe 292 via an air supply tube 300, a sealing nut 302, and a centrally located hole 304. Further, a pair of conical seats 306 are formed in the placement probe 292. In FIG. 11A, a syntron bowl is diagrammatically indicated at 308 carrying a chip 12.

OPERATION OF CHIP POSITIONER WORK TOOL

Due to the gearing arrangement, it can be seen that the pickup probe 284 and the placement probe 292 rotate in synchronism. Thus, when the bowl delivers a chip 12 below the pickup probe 284, a vacuum supply to the tube 294 causes the chip 12 to be picked up. Actuation of the rotary solenoid 274 causes the pickup and placement probe to be rotated in synchronism as indicated by the dotted lines in FIG. 11A. When they reach this position, they are oriented with respect to each other as illustrated in FIG. 11B, in other words, the pickup probe has picked up a chip having its ball contacts down. At this time, a vacuum will be applied to the hole 304 in the placement probe 292 and simultaneously therewith the vacuum will be removed from the hole 298 and a slight positive air supply delivered thereto such that the chip 12 will be blown from the pickup probe 284 and attracted to the placement probe. The ball contacts on the chip 12 will be accepted by the conical seats 306 in the placement probe 292. The pickup and placement probe will then be rotated by rotary solenoid 274 to the position shown in FIG. 11A to await a further operation. Obviously, the placement probe is now in a position such that when it is indexed around to the substrate, the substrate may be raised as previously described so as to bring the chip into contact with the substrate.

DETAILED DESCRIPTION OF THE SUBSTRATE HOLDER ASSEMBLY

Figure 12:
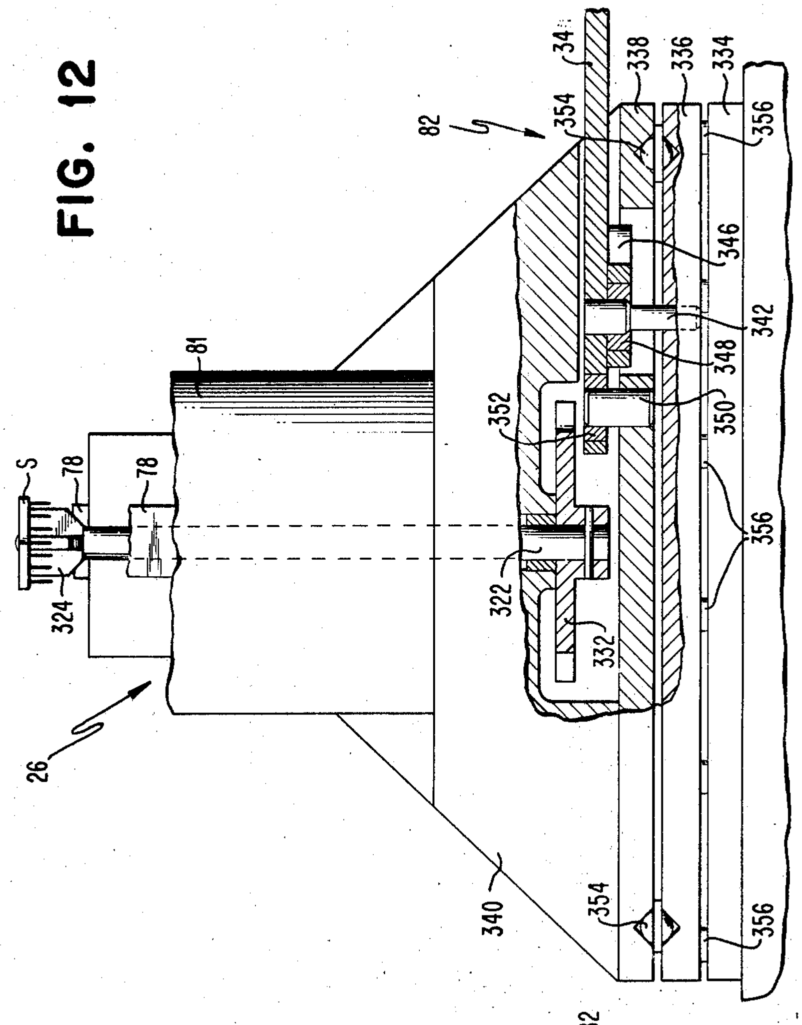
FIGS. 12 and 12A are enlarged partial sectional views of the substrate holder assembly shown in FIGS. 1 and 3.
Figure 12A:
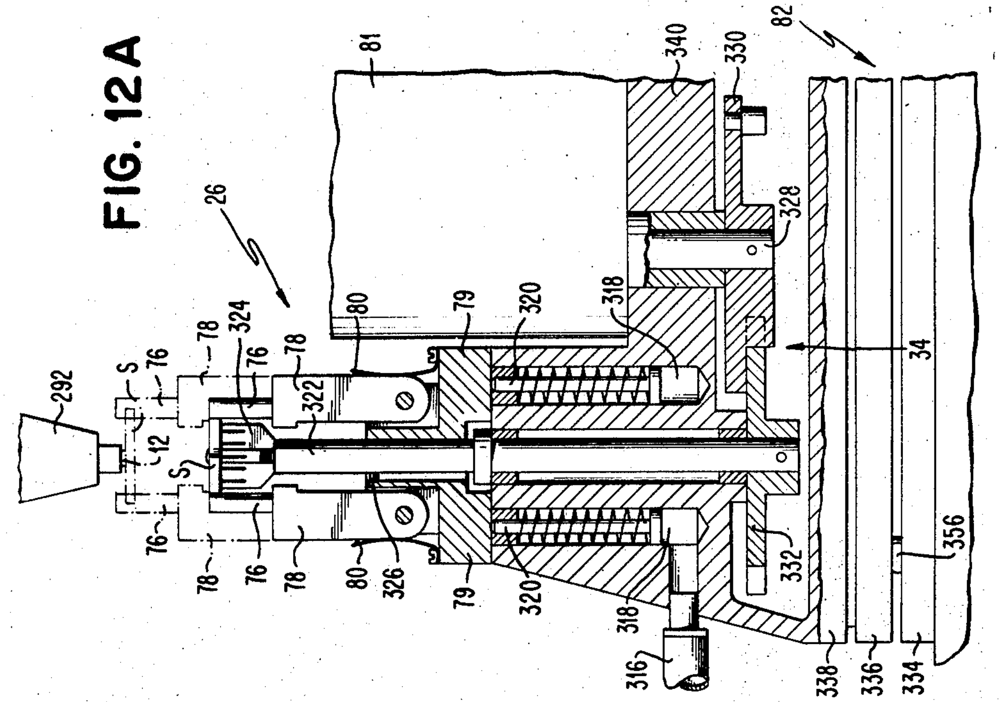
Figure 13:
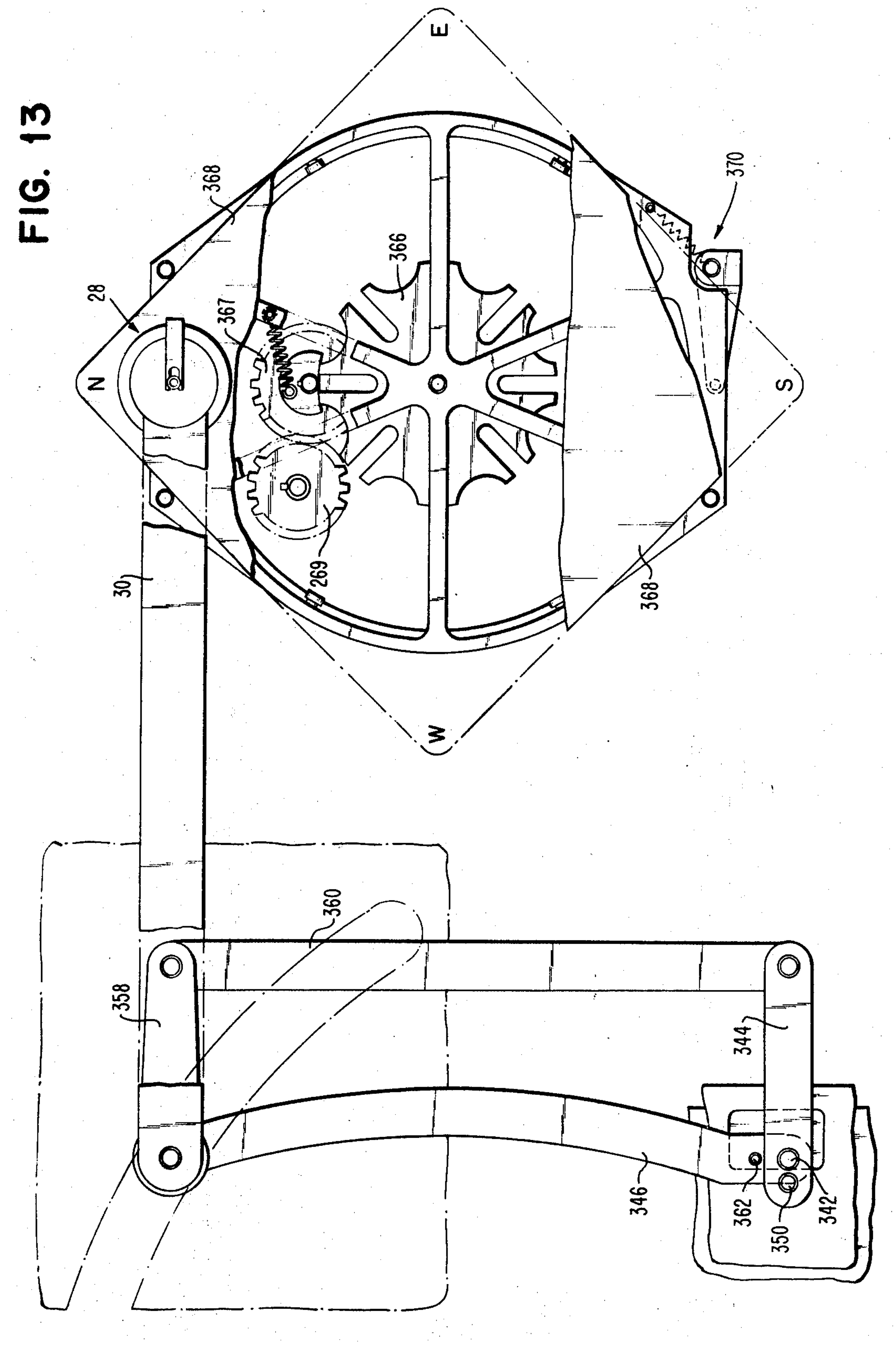
FIG. 13 is an enlarged plan view of the pantograph assembly of FIG. 1 with sections cut away to reveal interior elements, and which particularly illustrate the connection between the pantograph assembly and the base of the X–Y table for moving the substrate with respect to a stationary work tool.

Now referring to FIGS. 12 and 12A and 13, they show in greater detail the substrate holder assembly, and therein like reference numerals have been used to indicate like elements previously described in a more general manner with respect to FIGS. 1 and 3.

In order to move the substrate S upward to a contacting position with a work tool, diagrammatically designated P, an air supply is connected at an input connection 316 to a pair of air operated cylinders 318 which have a pair of respective piston means 320, which when actuated will move against the underside of the pair of turrets 79 so as to raise the pair of arms 78 towards the work probe 292.

A shaft 322 having a substrate table means head portion 324 is fixedly attached to the pair of turrets 79 by a locking key means 326. A shaft 328 from the motor 81 connects to a Geneva driver gear 330, which in turn meshes with Geneva driven gear 332 fixedly attached to the shaft 322. Energization of the motor 81 will result in the turrets 79 being driven to any one of four locating positions previously described as N, S, W, or E in accordance with the selection of the appropriate push button 40 on the operator's console 42.

In order to obtain fine positioning of the substrate S with respect to the work probe 292, the X–Y table previously indicated generally as 82 is shown as having an X plate 334, a Y plate 336, and a plate 338. Plate 338 forms the base of the pyramid like housing structure 340. A shot pin 342 is fixedly mounted to a pantograph link arm 344 and to the X plate 334 and provides a fixed pivot point. The shot pin 342 connects to a pantograph link arm 346 through a bearing 348 at the fixed pivot point. A movable pivot point between pantograph link arm 344 and the plate 338 is provided by a pin 350 mounted within a bearing 352 connected to the arm 344. Appropriate roller elements as illustrated at 354 are seated in conical grooves so as to allow for relative movement between the plates 336 and 338. Similar roller elements indicated at 356 allow for relative movement between the plates 334 and 336.

As illustrated in greater detail in FIG. 13, the movement of the X–Y table 82 is accomplished by moving the operator's stylus 28 which in turn moves the pantograph arm 30 and link arms 358, 360, 344 and 346. They are of a conventional nature and form no part of this invention and may be designed to provide a 20/1 movement. In FIG. 13, point 362 corresponds to the fixed pivot point around the shot pin 342, as previously shown in FIG. 12. Point 364 corresponds to the movable pivot point around the pin 350.

Finally, with reference to FIG. 13, a conventional Geneva mechanism indicated generally at 366 and 367 is operative through gear 269 to move any one of the four positions N, E, S, W on a template 368 under the operator's stylus 28. The template may be held in position by a spring lock mechanism 370 which is adjustable to handle various sized templates. A module layout may be taped over the template, and thus, as previously described, the Geneva mechanism 366 moves the template 368 while simultaneously therewith the Geneva driven gear 332 moves the substrate S to a corresponding position with respect to a work tool.

In other words, each portion of the template, N, E, S, or W may have a module layout taped over it. In order to position a chip onto a different portion of a substrate, the module layout will be moved to the operator's stylus 28 while simultaneously moving the corresponding area of the substrate with respect to a stationary work tool. Although separate mechanisms are used to index the template and substrate, the mechanisms are controlled by the operator's console to operate simultaneously.

OPERATION OF SUBSTRATE HOLDER ASSEMBLY

In operation, a substrate S is placed between the gripping pins or means 76 which frictionally engage the substrate S according to an adjustable force through the spring means 80. The substrate table means is stationary with respect to a work tool or probe P and spaced a fixed predetermined distance apart. The driving means or air cylinders 318 are energized so as to move the substrate S towards the tool P a distance greater than the fixed predetermined distance. This raised position is shown by dotted lines in FIG. 12A. The tool or probe P will contact the substrate so as to move it slightly downward with respect to the gripping pins or means 76.

As each work tool is indexed into a stationary position over the substrate S and then contacted therewith, the gripping pins 76 will be moved away from the respective tool table a distance greater than the predetermined distance so as to reset the substrate upon contact with the substrate table head means 324.

While the invention has been particularly shown and described with reference to the preferred embodiment thereof, it will be understood by those skilled in the art that various changes in form and details may be made therein without departing from the spirit and scope of the invention.

What is claimed is:

1. An apparatus for mounting the backside of a semiconductor chip onto a substrate with the ball contacts of the chip on the topside comprising:

(a) a chip placement tool means for receiving a chip from a dispensing means, (b) a substrate table for receiving a substrate, and spaced a fixed predetermined distance from said chip placement tool means, (c) gripping means for frictionally engaging the substrate, (d) said gripping means disposed for movement relative to said substrate table, (e) driving means for moving said gripping means towards said chip placement tool means a distance greater than the predetermined fixed distance, and (f) said chip placement tool means contacting the substrate so as to move the substrate with respect to said gripping means.

2. An apparatus for mounting the backside of a semiconductor chip onto a substrate with the ball contact of the chip on the topside as in claim 1 wherein:

(a) said driving means moving said gripping means away from said chip placement tool means moves the same distance moved by said gripping means when it is moved towards said chip placement tool means subsequent to said chip placement tool means contacting the substrate.

3. An apparatus for mounting the backside of a semiconductor chip onto a substrate with ball contacts of the chip on the topside as in claim 1 further including:

(a) adjustable means connected to said gripping mean for providing frictional engagement to the substrate.

4. An apparatus for mounting the backside of a semiconductor chip onto a substrate with the ball contacts of the chip on the topside, and making strap connections from the ball contacts to the substrate comprising:

(a) a tool table means having a plurality of tools mounted thereon, (b) said plurality of tools including a flux tool means, a chip placement tool means, and a strap forming and placement tool means, (c) substrate table means for receiving the substrate, (d) said substrate table spaced a fixed predetermined distance from said plurality of tools, (e) gripping means for frictionally engaging the substrate, (f) the substrate being disposed between said tool table means and said gripping means, (g) said gripping means disposed for movement with respect to said substrate table means, (h) indexing means connected to said tool table means for sequentially moving each of said plurality of tools into a stationary position over said substrate table means, (i) driving means for moving said gripping means towards said tool table means each time one of said plurality of tools is in a sttaionary position over said substrate table means, (j) said gripping means being moved a distance greater than the fixed predetermined distance so that each of said plurality of tools contacts with the substrate, and (k) said driving means moving said gripping means away from said tool table means the same distance moved by said gripping means when it is moved towards said tool table subsequent to each of said plurality of tools contacting the substrate.

5. An apparatus for mounting the backside of a semiconductor chip onto a substrate with the ball contacts of the chip on the topside, and making strap connections from the ball contacts to the substrate as in claim 4 further including:

(a) adjustable means connected to said gripping means for providing frictional engagement to the substrate.

References Cited

UNITED STATES PATENTS

| | | | |
|---|---|---|---|
| 3,226,810 | 1/1966 | Beliveau | 29—203 |
| 3,239,719 | 3/1966 | Shower | 317—101 |
| 3,307,763 | 3/1967 | Rasimenkos et al. | 228—44 X |
| 3,337,941 | 8/1967 | Drop | 29—203 |
| 3,344,900 | 10/1967 | Drop | 29—203 X |
| 3,367,476 | 2/1968 | Aronstein et al. | 198—33 |

OTHER REFERENCES

SCP and Solid State Technology, June 1966, p. 47.

"Substrate Clamp for Pinning Machine," Beumer et al., IBM Journal, August 1966, vol. 9, No. 3, pp. 307 and 308.

THOMAS H. EAGER, Primary Examiner

U.S. Cl. X.R.

29—208